United States Patent [19]
Dabral

[11] Patent Number: 5,973,526
[45] Date of Patent: Oct. 26, 1999

[54] COMPENSATING A CHARACTERISTIC OF A CIRCUIT

[75] Inventor: Sanjay Dabral, Milpitas, Calif.

[73] Assignee: Intel Corporation, Santa Clara, Calif.

[21] Appl. No.: 08/994,083

[22] Filed: Dec. 19, 1997

[51] Int. Cl.[6] .......................... H03K 5/12; H03K 17/296
[52] U.S. Cl. .............................................. 327/170; 327/393
[58] Field of Search ................................. 327/292, 293, 327/295, 297, 147, 156, 157, 158, 262, 276, 277, 170, 392, 393, 394, 395, 396, 399, 400, 401

[56] References Cited

U.S. PATENT DOCUMENTS

| | | | |
|---|---|---|---|
| 4,808,884 | 2/1989 | Hull et al. .............................. | 327/156 |
| 4,922,141 | 5/1990 | Lofgren et al. ........................ | 327/158 |
| 5,087,829 | 2/1992 | Ishibashi et al. ...................... | 327/295 |
| 5,122,679 | 6/1992 | Ishii et al. ............................. | 327/295 |
| 5,428,309 | 6/1995 | Yamauchi et al. .................... | 327/158 |
| 5,712,884 | 1/1998 | Jeong .................................... | 327/158 |

OTHER PUBLICATIONS

T. Shirotori et al., *PLL–based Impedance Controlled Output Buffer*, 1991 Symp. On VLSI Circuits, pp. 49–50.

Primary Examiner—Toan Tran
Attorney, Agent, or Firm—Trop, Pruner, Hu & Miles, P.C.

[57] ABSTRACT

A method and apparatus is described for compensating circuits. A different locked loop circuit is placed adjacent to a different one of each of the circuits to be compensated. A periodic signal is distributed to each of the locked loop circuits, and each locked loop circuit generates an output signal that is indicative of the frequency of the signal. The output signal of each locked loop circuit is used to compensate the adjacent circuit.

12 Claims, 8 Drawing Sheets

COMPENSATING A CHARACTERISTIC OF A CIRCUIT

BACKGROUND INFORMATION

The invention relates to compensating a characteristic (a slew rate, for example) of a circuit.

Referring to FIG. 1, an integrated circuit package, or chip 5, might have a bias generator 6 for generating bias voltages for circuits 8 (e.g., I/O predrivers) of the chip 5. These bias voltages typically are transmitted from the bias generator 6 to the circuits 8 via bias distribution networks 7 (e.g., conductive traces and filtering capacitors).

Quite often, this global biasing scheme is used to adjust, or compensate, one or more characteristics (e.g., a slew rate or output resistance) of each circuit 8. One or more external bias resistors 4 might be used to set the desired value that is used to compensate the circuits 8 to different levels.

There may be some difficulties associated with these schemes. For example, the above-described global biasing scheme often encounters difficulties due to variations in the local climates among the circuits 8 (i.e., variations in the conditions, such as actual process parameters, temperatures, and voltages that define the local environments of the circuits 8). Also, the global biasing scheme may be subject to noise errors. Thus, these existing compensation schemes may somehow be less effective than desired. Also, the programming resistors have a tolerance (approximately 5%) which introduce compensation errors. Multiple resistors may be required. These resistors typically require package pins, on-chip pads and compensation generator circuitry, all which consume area.

Alternatively, a chip 10 (see FIG. 2) might use a local biasing scheme to compensate the circuits 8 in the neighboring area. In this scheme, each circuit 8 has its own bias generator 9 which furnishes bias voltages for compensation. The levels of the bias voltages may be adjusted via one or more resistors 11 that are coupled to each bias generator 9. As a result, each circuit 8 may be compensated independently of the other circuits 8. In this case, each circuit will be in its local environment.

Quite often, even with the local biasing scheme, it is difficult to adjust the level of the bias voltages to the desired levels due to tolerances of the resistors 11. Furthermore, the resistors 11 may introduce system noise which introduces additional jitters in the compensation setting.

Thus, there is a continuing need for a globally effective compensation circuit that accounts for local variability, without excessive noise induced errors, and is economical on package pins, on chip pads and provides a very accurate standard reference for compensation calibration.

SUMMARY OF THE INVENTION

In one embodiment, the invention is generally directed at compensating a slew rate of a circuit by placing a locked loop circuit (e.g., a delayed locked loop or phase locked loop circuit) adjacent to the circuit. The locked loop circuit uses a reference periodic signal (e.g., a clock signal) to generate a compensation signal which reflects both the frequency of the periodic signal and the local climate of the circuit to be compensated. Generally, in another embodiment, the invention features a method that is used to compensate slew rates of circuits. A different locked loop circuit is placed adjacent to a different one of each of the circuits to be compensated. A periodic signal is distributed to each of the locked loop circuits, and each locked loop circuit generates a signal, such as a control signal, that is indicative of the frequency of the periodic signal. This control signal of each locked loop circuit is used to compensate the slew rate of the adjacent circuit.

Generally, in another embodiment, the invention features an integrated circuit that includes a circuit which has a slew rate that is responsive to a local climate and a compensation signal. A locked loop circuit of the integrated circuit is subject to the local climate. The locked loop circuit has a circuit that has a frequency response which is responsive to the local climate and the compensation signal. The circuit of the locked loop circuit generates a second periodic signal based on the frequency response. A comparator of the locked loop circuit compares the phases of the first and second periodic signals and adjust the compensation signal until the frequencies are substantially a predetermined difference apart.

Generally, in yet another embodiment, the invention features a system that includes circuits. Each of these circuits has a slew rate that is compensated by a control signal. Adjacent to each of these circuits is a locked loop circuit that generates the signal based on the periodic signal.

Other advantages and features will become apparent from the following description and from the claims.

DESCRIPTION

Figure 1:
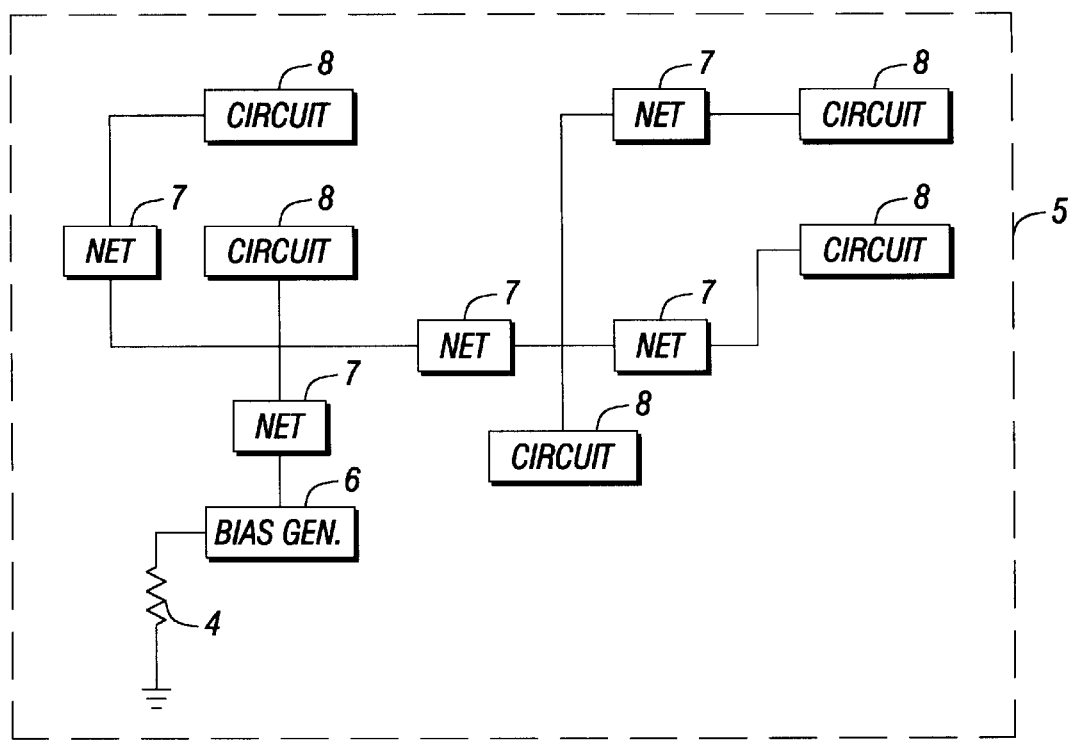
FIGS. 1 and 2 are schematic diagrams of compensation schemes of the prior art.
Figure 2:
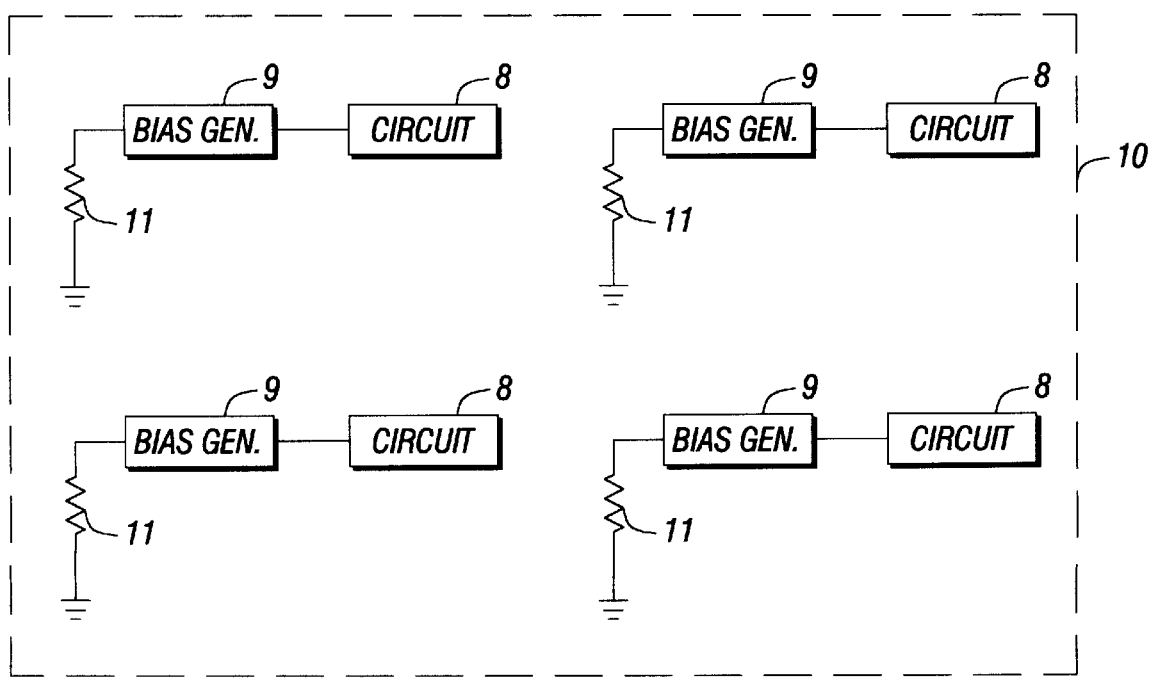
Figure 3:
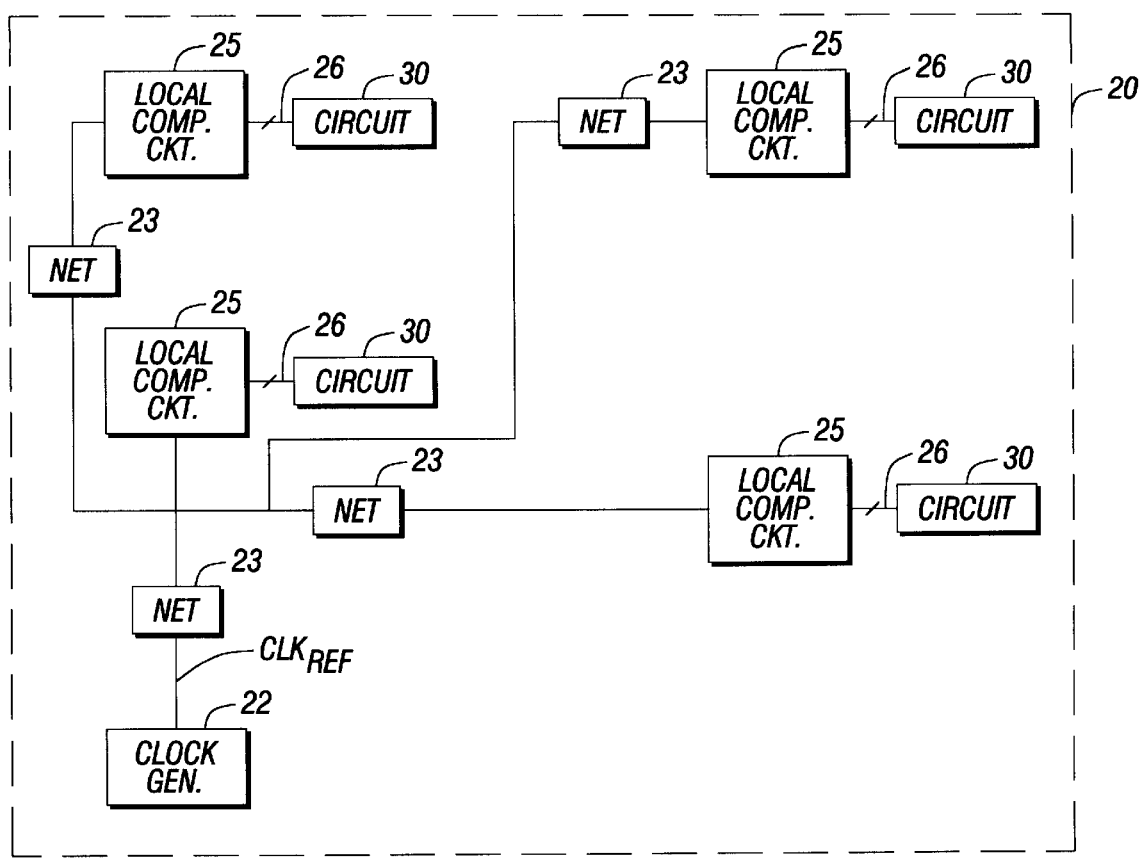
FIG. 3 is a schematic diagram of a compensation scheme according to an embodiment of the invention.

Referring to FIG. 3, an integrated circuit 20 uses a global compensation scheme (described below) to compensate circuits 30 based on the local climate of each circuit 30. To accomplish this, the integrated circuit 20 uses a reference clock signal (called $CLK_{REF}$) to transmit reference information across the integrated circuit 20. This reference clock signal is generated by a clock generator 22 (e.g., an oscillator). In one embodiment, for each circuit 30 to be compensated, this information is used by an associated local compensation circuit 25 (described below) which is located adjacent to the circuit 30. Based on the local climate and the frequency of the $CLK_{REF}$ signal, the local compensation circuit 25 generates one or more bias voltage level(s) on line(s) 26 that are used to compensate a slew rate, for example, of the circuit 30.

Thus, the local climate of the circuit 30 is taken into account when compensating the circuit 30. In this context, the term "local climate" means the conditions near or at the circuit that affect the performance of the circuit 30, such as, for example, the temperature, voltage and process parameters. The process parameters might include, for example, effective channel lengths, threshold voltages and orientation effects, all of which are subject to process variations across the integrated circuit. The term "adjacent" in this context means close enough to the circuit 30 to experience substantially the same local climate as the circuit 30 to fall within a prescribed tolerance.

Because a clock generator 22 is used to effectively set the bias voltages (as modified by each circuit 25 to compensate for the local climate), a crystal, in some arrangements, is the external part employed. Thus, this compensation scheme may replace external resistors which have a high tolerance (e.g., 5 percent) with crystals that may have accuracies of tens of parts per million (ppm).

The advantages of the above-described arrangement may include one or more of the following. The reference clock signal is less prone to noise errors than global bias voltages. A crystal that has an accuracy of tens of parts per million may used to establish the frequency of the clock signal. Only one external compensation pin may be needed for an entire chip or the existing chip clock can be used, thereby saving the pin. For the off chip bus, bus performance may be improved, and system manufacturing costs may be reduced. Preexisting locked loop circuits can be used, thereby saving area which would otherwise be required for package pins, on chip pads and the compensation generation circuits. Slew rates can be compensated based on the local climate.

Figure 4:
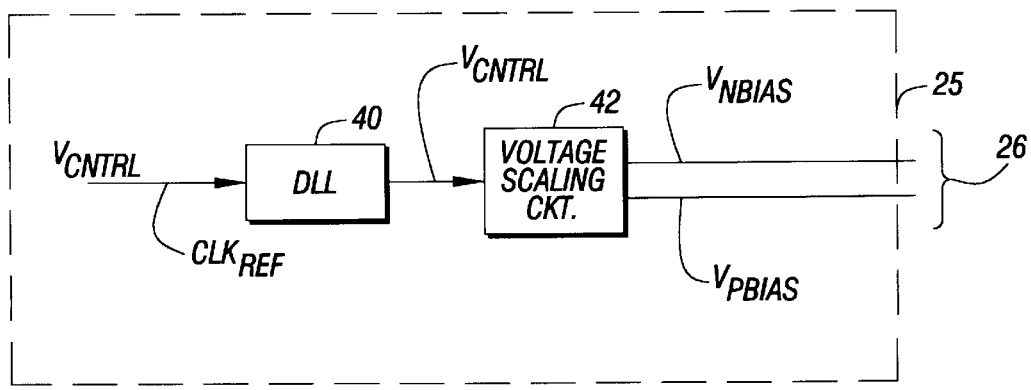
FIG. 4 is a schematic diagram of a local compensation circuit of FIG. 3.

Referring to FIG. 4, the local compensation circuit 25, in one embodiment, has a locked loop circuit, such as a delay locked loop (DLL) circuit 40 or a phase locked loop circuit (described below), that is configured to receive and lock onto the $CLK_{REF}$ signal. To accomplish this, the DLL circuit 40 generates a control voltage (called $V_{CNTRL}$) which indicates the DLL circuit's approximation of the frequency of the $CLK_{REF}$ signal. Through an iterative process, this approximation becomes more and more accurate until the DLL circuit 40 locks onto the $CLK_{REF}$ signal.

By design, the $V_{CNTRL}$ signal is supposed to have a predetermined voltage level for a predetermined frequency (e.g., 100 Mhz) of the $CLK_{REF}$ signal. It is assured by design that the DLL circuit 40 is able to lock at the $CLK_{REF}$ frequency over all the climate variations including voltage, process and temperature. The level of the $V_{CNTRL}$ voltage is self-adjusting and eventually approaches the level that results in the locked loop circuit locking onto the $CLK_{REF}$ signal.

The locked loop circuit may be used for purposes other than compensation. For example, the locked loop circuit may be used to generate other clock signals from a reference clock signal. In this manner, this global compensation scheme may use, for example, one or more preexisting locked loop circuit(s) of an integrated circuit.

To linearly scale the level of the $V_{CNTRL}$ voltage into bias voltage level(s) (e.g., voltage levels called $V_{NBIAS}$ and $V_{PBIAS}$) for use by the circuit 30, the local bias compensation circuit 25 has a voltage distribution circuit 42, further described below. Depending on the embodiment, the compensation circuit 25 may or may not include the circuit 42, and if included, the circuit 42 may or may not be part of the DLL circuit 40.

Figure 5:
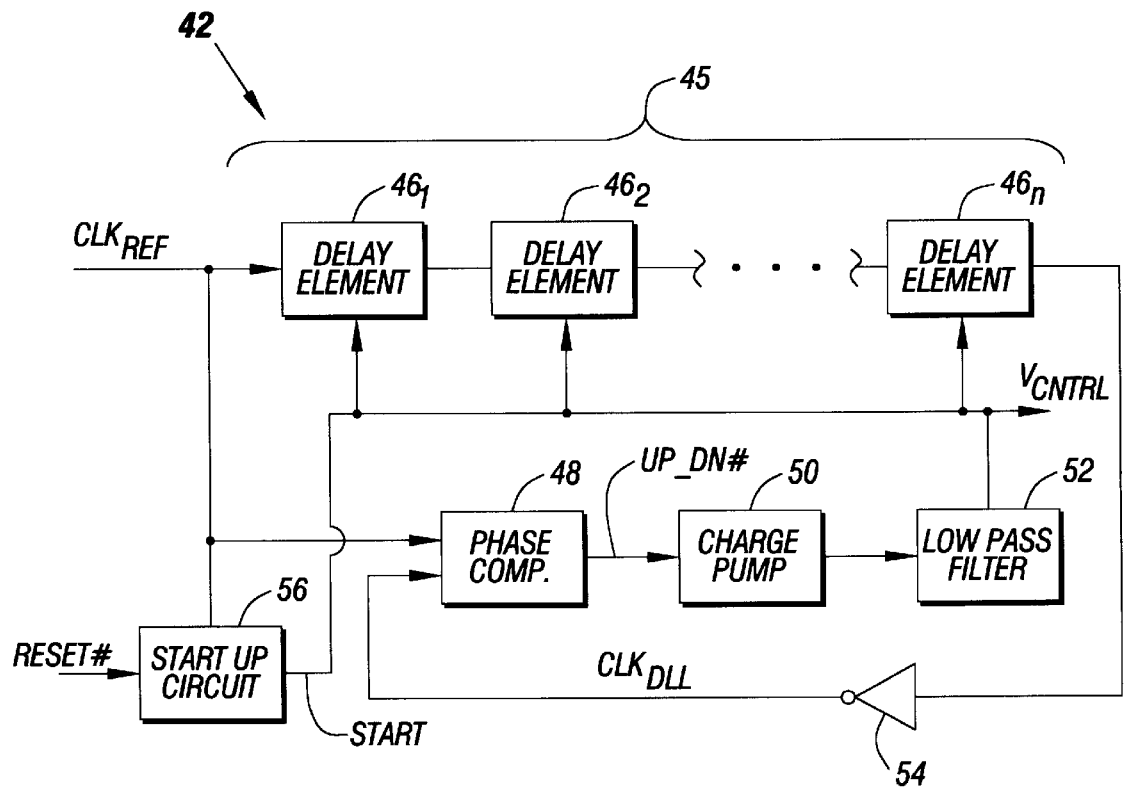
FIG. 5 is a schematic diagram of a delay locked loop circuit of the local compensation circuit of FIG. 4.

Referring to FIG. 5, the DLL circuit 40 locks onto the frequency of the $CLK_{REF}$ signal by undergoing several "lock in" cycles until the $V_{CNTRL}$ voltage stabilizes and meets the frequency and a designed phase offset (e.g., zero or one hundred eighty degrees) of the $CLK_{REF}$ signal. To accomplish this, the DLL circuit 40 includes a chain 45 of n, serially coupled delay elements 46 (i.e., elements $46_1$, $46_2$, . . . $46_n$.) The propagation delay of each element 46 is controlled by the level of the $V_{CNTRL}$ voltage, and when the $V_{CNTRL}$ voltage stabilizes at the level that indicates the frequency of the $CLK_{REF}$ signal, the output signal of the delay chain 45 represents the $CLK_{REF}$ signal delayed by 360 degrees. When this occurs, the DLL circuit 40 is locked onto the $CLK_{REF}$ signal.

Thus, when the DLL circuit 40 locks onto the $CLK_{REF}$ signal, each delay element 46 has a propagation delay equal to T/n, where T is the period of the $CLK_{REF}$ signal. Therefore, if the actual local climate of the delay element 46 is the same as the climate for which the DLL circuit 40 (and circuit 30) was designed, then each delay element 46 should introduce a T/n propagation delay when the $V_{CNTRL}$ voltage reaches the locked level. However, the local climate is quite often different from the assumed climate, and the delay element may be faster (i.e., may introduce a shorter propagation delay) or slower (i.e., may introduce a longer propagation delay) than expected.

As a result, when the DLL circuit 40 locks onto the $CLK_{REF}$ signal, the level of the $V_{CNTRL}$ voltage may be higher (for a slower than expected delay element 46) or lower (for a faster than expected delay element 46) than the predetermined level. However, these differences directly reflect how the circuit 30 responds to the local climate and serve to automatically compensate the circuit 30 for the local climate. For example, if the delay element 46 is faster than expected, then so is the circuit 30, and as a result, the $V_{CNTRL}$ voltage has to be lower than the ideal predetermined value to properly compensate the circuit 30. Similarly, if the delay element 46 is faster than expected, then so is the circuit 30, and as a result, the $V_{CNTRL}$ voltage has to be lower than the ideal predetermined value to properly compensate the circuit 30.

To determine the phase error between the DLL circuit 40 generated clock and the reference $CLK_{REF}$ signal, a phase comparator 48 of the DLL circuit 40 continually compares the phases of the two signals $CLK_{REF}$ and $CLK_{DLL}$ and generates a duty cycle-modulated signal (called UP_DN#) which indicates the result of the comparison. This signal is in turn used to trigger a charge pump which alters the control voltage. The voltage is altered such that if the $CLK_{DLL}$ is ahead of the $CLK_{REF}$ then the voltage is changed to slow down the DLL loop. If the $CLK_{DLL}$ is behind of the $CLK_{REF}$ then the voltage is changed to speed up the DLL loop.

The DLL circuit 40 has a low pass filter 52 which prevents the DLL circuit 40 from locking onto a frequency (e.g., a harmonic frequency of the $CLK_{REF}$ signal) other than the fundamental frequency of the $CLK_{REF}$ signal. Depending on the embodiment, the low pass filter 52 may or may not include circuitry separate from the circuitry of the charge pump 50.

The DLL circuit 40 also includes a start up circuit 56 to keep the DLL circuit 40 from locking onto a harmonic frequency of the $CLK_{REF}$ signal. The start up circuit 56 is constructed to hold the $V_{CNTRL}$ signal near a negative supply voltage $V_{SS}$ (e.g., ground) during a first predetermined number (e.g., eight) of cycles of the $CLK_{DLL}$ signal. In this manner, once the start up circuit 56 releases the $V_{CNTRL}$ signal, the delay chain 45 indicates a frequency much lower than frequency of the $CLK_{REF}$ signal. Thus, at start-up, the frequency of the $CLK_{REF}$ signal is between the frequency indicated by the delay chain 45 and the frequencies of higher harmonic signals. Therefore, at start-up, the DLL circuit 40 rejects the higher harmonic frequencies.

Figure 6:
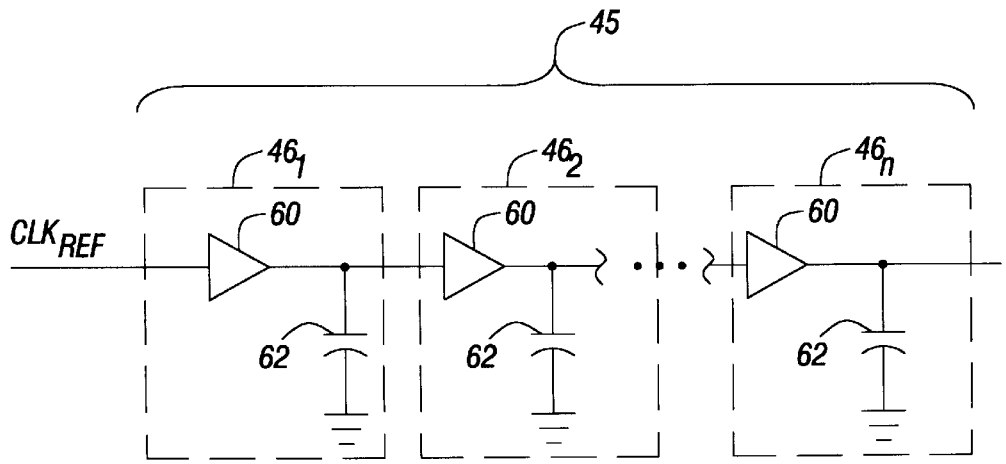
FIG. 6 is a schematic diagram of one possible delay element chain for the delay locked loop circuit of FIG. 5.

Referring to FIG. 6, the DLL circuit 40 may have one of many different designs. For example, in some embodiments, the delay element 46 may have a design that is substantially close to the circuit 30 to be compensated. For example, the circuit 30, in some embodiments, is an input/output (I/O) predriver circuit 200 (see FIG. 12, described below) that furnishes data signals to a driver circuit which in turn drives, for example, a line of a off chip bus. For these embodiments, the delay element 46 includes a predriver circuit 205 that includes an electrical equivalent of the circuit 30.

The delay element also includes a capacitor 62 to simulate the loading of the driver at an output terminal of the predriver 206. Thus, the DLL circuit 40 provides RC compensation. As a result of this arrangement, when the DLL circuit 40 locks onto the $CLK_{REF}$ signal, the voltage or voltages used to control the delays of the predriver delay elements are substantially the same voltages used to compensate the predriver 205.

In other embodiments, the DLL circuit has delay elements that are not electrical equivalents of the circuits 30. However, the local climate is still reflected in the propagation delay introduced by the delay element for a given $V_{CNTRL}$ voltage level. A scaling circuit (such as the circuit 42, described below) which translates the $V_{CNTRL}$ voltage to one or more levels suitable for the circuit 30 may be required.

Figure 7:
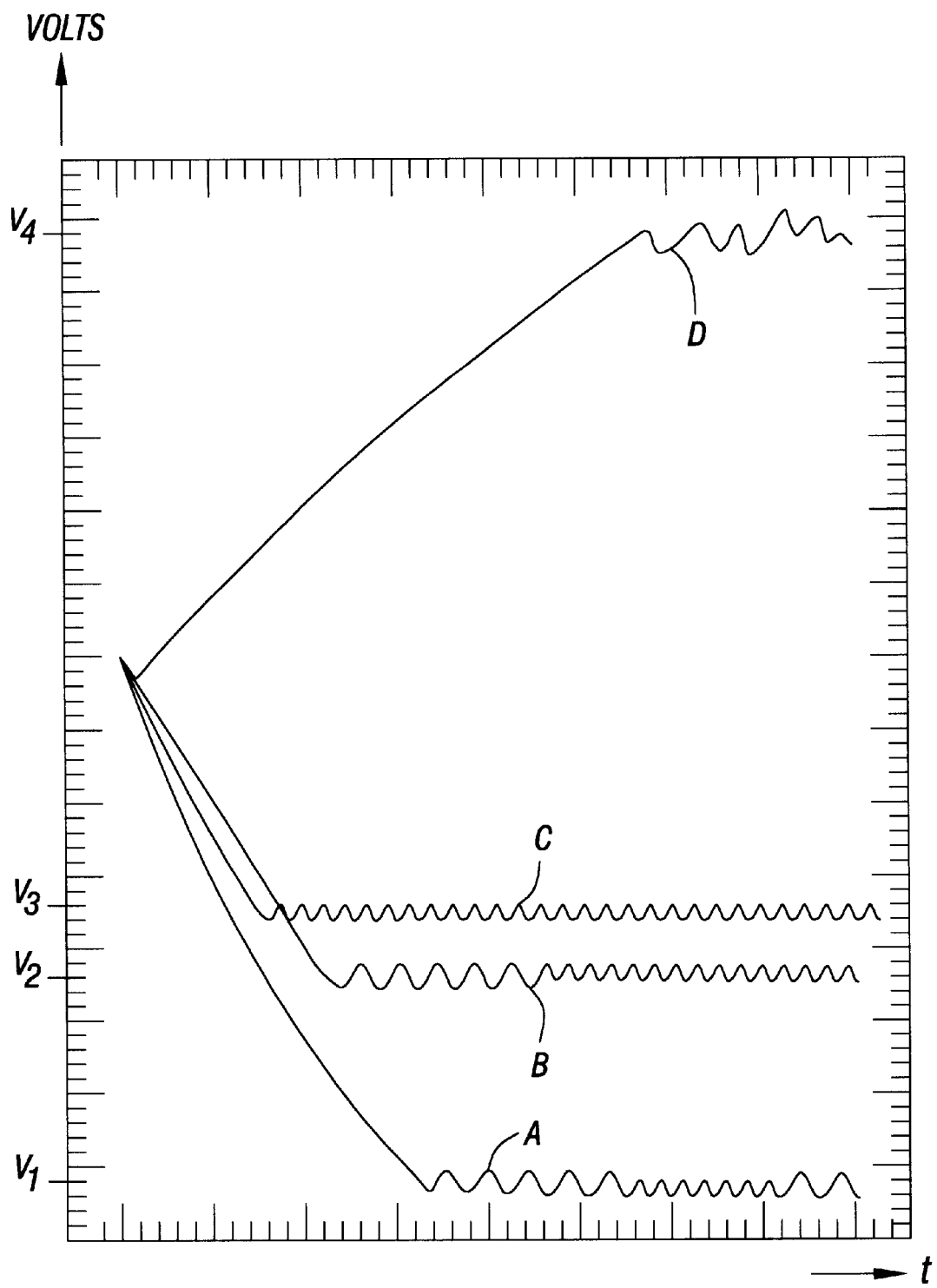
FIG. 7 shows waveforms illustrating the output of the delay locked loop circuit of FIG. 5 when compensating different types of predriver circuits.
Figure 8:
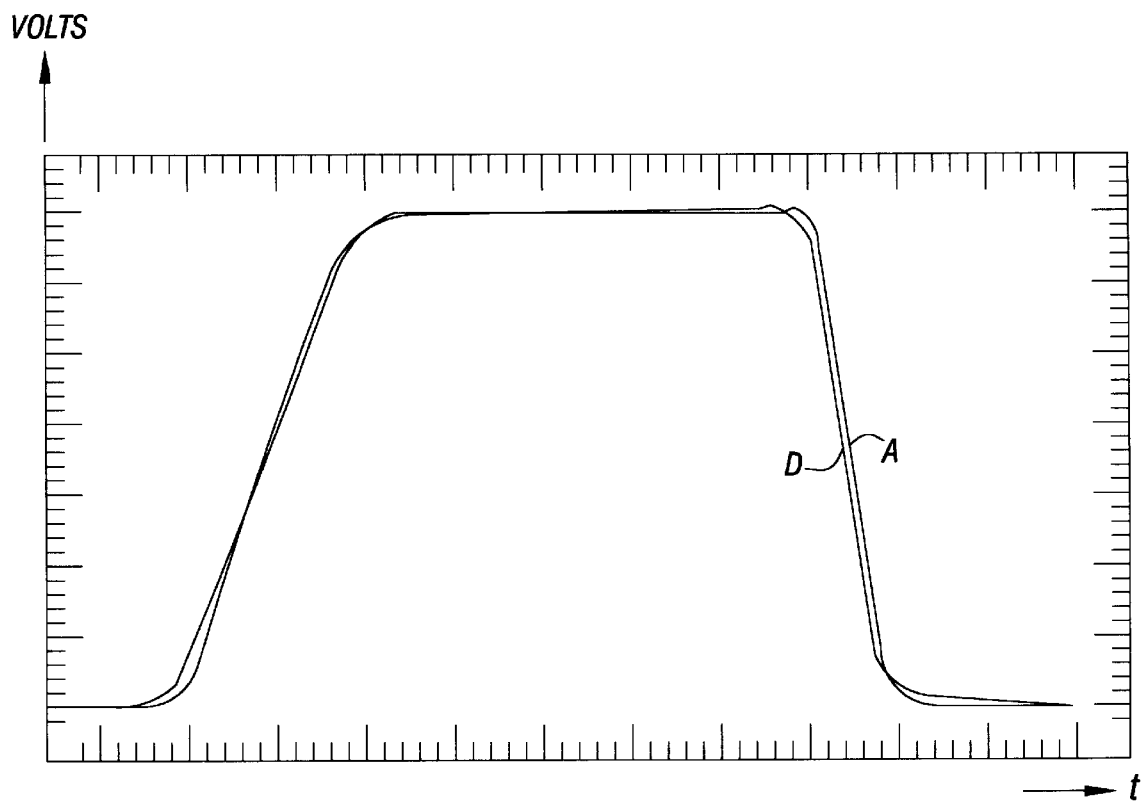
FIG. 8 shows waveforms illustrating slew rates for fast and slow compensated predriver circuits.
Figure 9:
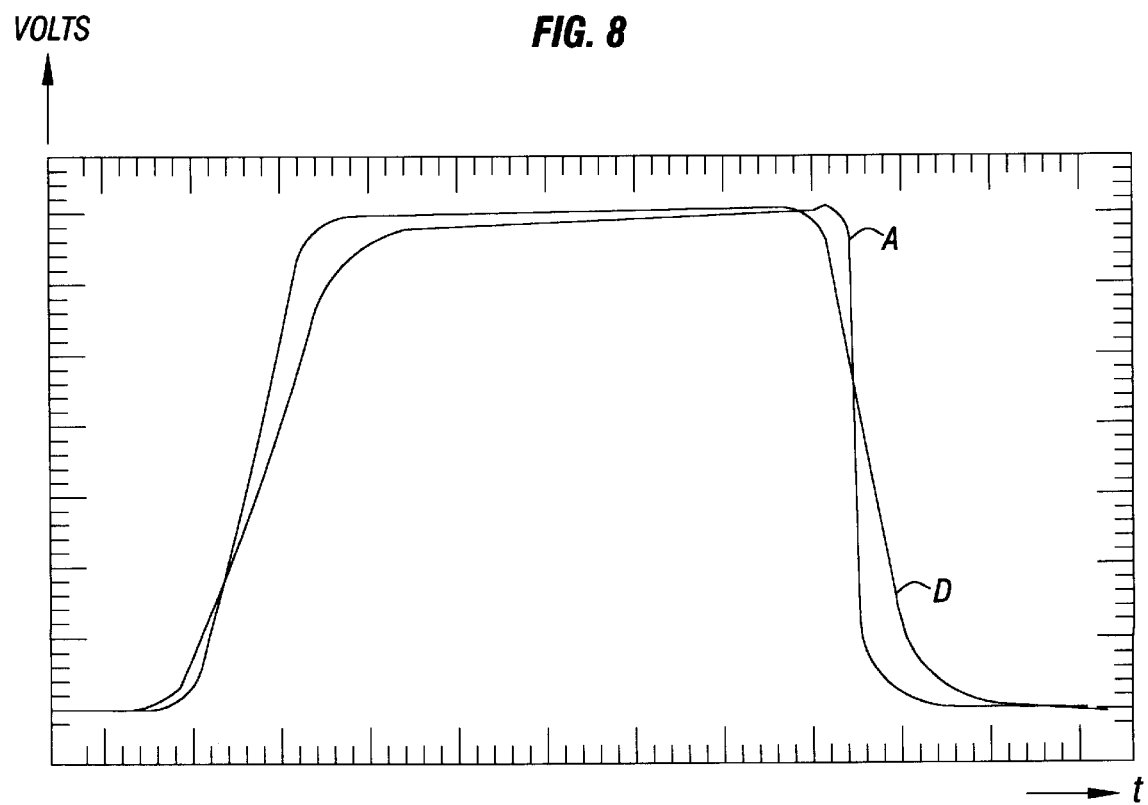
FIG. 9 shows waveforms illustrating slew rates for fast and slow uncompensated predriver circuits.

FIGS. 7–9 show results of simulation tests performed on the circuit 30 where the circuit 30 includes a predriver. Referring to FIG. 7, different levels (i.e., levels $V_1$, $V_2$, $V_3$ and $V_4$) of the $V_{CNTRL}$ voltage are shown for substantially different climates (i.e., climates A, B, C and D) which affect the speed of the predriver. The frequency of the $CLK_{REF}$ signal remains substantially the same for all four climates. The $V_{CNTRL}$ voltage has its lowest level $V_1$ when the predriver is in the climate A that does not employ a large compensation voltage to operate at a relatively fast speed. The $V_{CNTRL}$ voltage has its highest level $V_4$ when the predriver is in a climate D which, without compensation, causes the predriver to operate at a relatively slow speed. Large differences, such as the difference between climates A and D, might be found on different chips, and smaller differences may occur on the same chip. The DLL circuit 40 is constructed to lock over the complete spread of variations.

Referring to FIG. 8, due to the local compensation provided by the DLL circuits 40, the slew rates vary only slightly among the predrivers, even though each predriver is located in a substantially different local climate even if they are on different components. For example, the slew rates of the predrivers in climates A and D vary by a factor of approximately 1.04. Without compensation (see FIG. 9), the slew rates of the predrivers in climates A and D vary by a factor of approximately 2.2.

Figure 10:
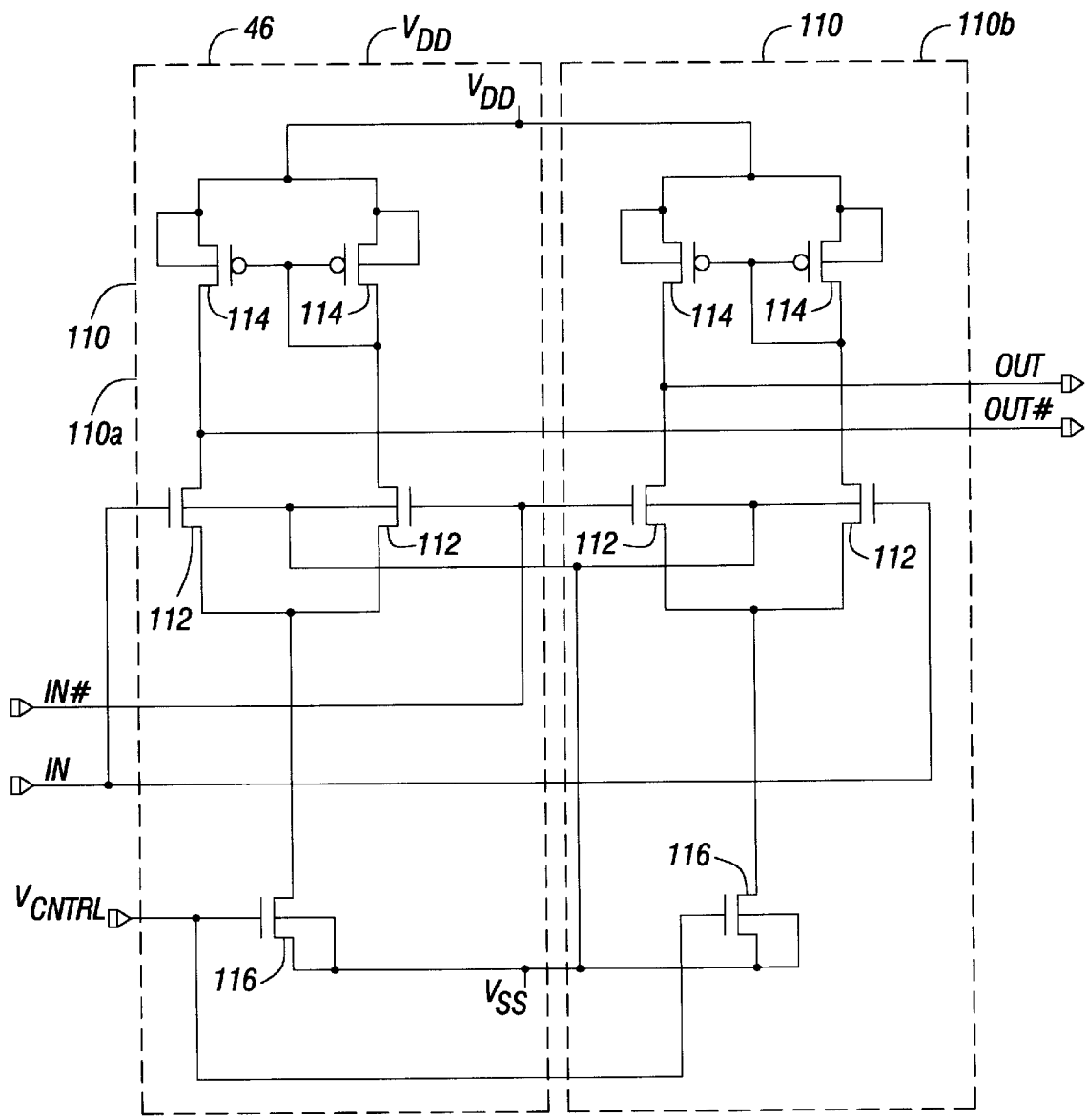
FIG. 10 is a schematic diagram of one possible delay element for the delay locked loop circuit of FIG. 5.

As stated above, the delay element 46, may have one of many possible designs, with some of the designs including an electrical equivalent of the circuit 30. As another example, in some embodiments, the delay element 46 includes two differential amplifiers 110 (see FIG. 10) instead of the electrical equivalent of the circuit 30. Both of the differential amplifiers 110 receive a non-inverting input signal (called IN) and an inverting input signal (called IN#). For the first delay element $46_1$ of the delay chain 45, the IN signal is the $CLK_{REF}$ signal, and the IN# signal is an inverted representation of the $CLK_{REF}$ signal.

Collectively, the amplifiers 110 furnish a differential output. In this manner, in one embodiment, for example, the amplifier 110a furnishes a single ended, inverted output signal (called OUT#), and the amplifier 110b furnishes a single ended, non-inverted output signal (called OUT). For the last delay element $46_n$ of the delay chain 45, the OUT signal is the $CLK_{DLL}$ signal.

The differential amplifier 110 has a differential pair formed from two matched NMOS transistors 112. The drain of each different transistor 112 is coupled to the drain of a different PMOS load transistor 114. The two transistors 114 have their sources coupled to the $V_{DD}$ supply voltage and are coupled in a current mirror arrangement. The drain of one of the NMOS transistors 112 furnishes the OUT signal, and the drain of the other NMOS transistor 112 furnishes the OUT# signal. The sources of the transistors 112 are both coupled to the drain of an NMOS transistor 116 which serves as a constant current source. The magnitude of this current is controlled by the level of the $V_{CNTRL}$ signal which is received at the gate of the transistor 116. The source of the transistor 116 is coupled to the $V_{SS}$ supply voltage.

Figure 11:
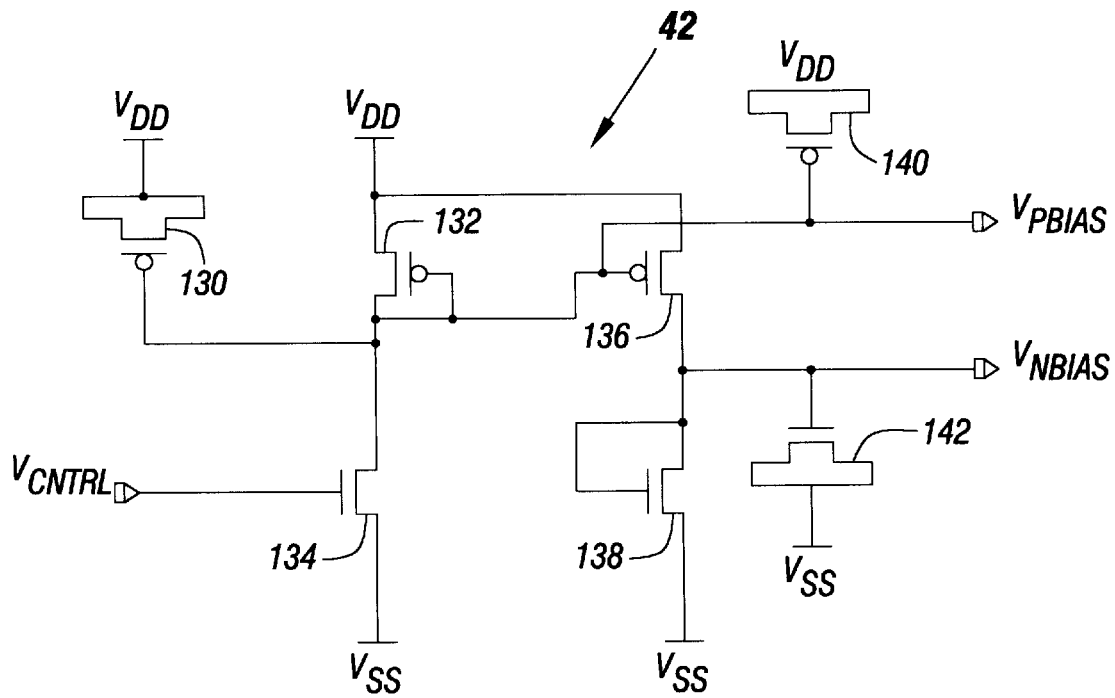
FIG. 11 is a schematic diagram of a voltage distribution circuit.

In the case where the compensated circuit (delay element) is not the circuit in use, the $V_{CNTRL}$ has to be translated to a usable form. Referring to FIG. 11, although different embodiments are possible, in some embodiments, the voltage distribution circuit 42 (see FIG. 4) includes an NMOS transistor 134 that receives the $V_{CNTRL}$ voltage at its gate. The drain of the NMOS transistor 134 is coupled to the gate and drain of a PMOS transistor 132, and the source of the NMOS transistor 134 is coupled to the $V_{SS}$ supply voltage. The source of the PMOS transistor 132 is coupled to the $V_{DD}$ supply voltage, and the gate of the transistor 132 is coupled to the gate of a PMOS transistor 136. The source of the PMOS transistor 136 is coupled to the $V_{DD}$ supply voltage, and as a result, the PMOS transistors 132 and 136 form a current mirror. The drain of the PMOS transistor 136 is coupled to the gate and drain of an NMOS transistor 138. The source of the NMOS transistor 138 is coupled to the $V_{SS}$ supply voltage. The $V_{PBIAS}$ voltage is provided by the drain voltage of the transistor 132, and the $V_{NBIAS}$ voltage is provided by the drain voltage of the transistor 138.

Thus, the level of the $V_{CNTRL}$ voltage sets the gate-to-drain voltage of the transistor 134 which in turn sets the current flowing through the PMOS 136 and NMOS 138 transistors. This current, in turn, sets the levels of the $V_{PBIAS}$ and $V_{NBIAS}$ voltages. In other implementations, two DLL circuits, for example, can produce the corresponding $V_{PBIAS}$ and $V_{NBIAS}$ or a replica bias circuit, for example, can be used.

Figure 12:
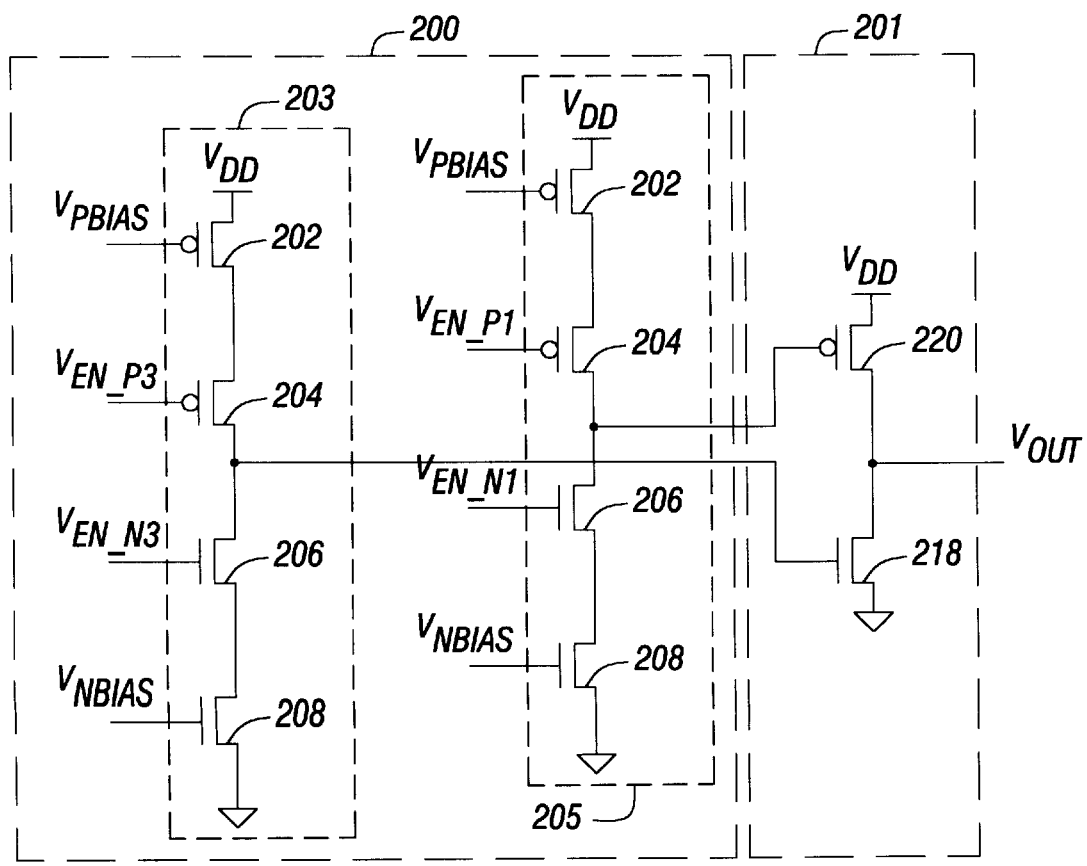
FIG. 12 is a schematic diagram for a possible predriver circuit that is compensated by the delay locked loop circuit of FIG. 5.

Referring to FIG. 12, the circuit 30, in some embodiments, includes a predriver 200 which furnishes two output signals to drive a driver 201. The driver 201, for example, might drive a line on a bus. The driver 201 is essentially a CMOS inverter in which the gates of the NMOS 218 and PMOS 220 transistors are not coupled together. Instead, the gate of the NMOS transistor 218 is driven by a CMOS inverter 203 of the predriver 200, and the gate of the PMOS transistor 220 is driven by a CMOS inverter 205 of the predriver 200. The drains of the transistors 218 and 220 are coupled together to furnish an output signal of the driver 201, and the sources of the transistors 218 and 220 are coupled to ground and the voltage level $V_{DD}$, respectively.

Figure 13:
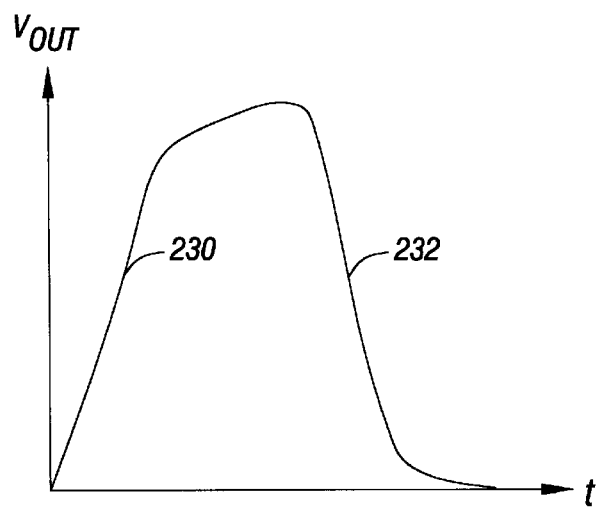
FIG. 13 is an illustration of a waveform from the circuit of FIG. 12.

Each inverter 203, 205 of the predriver 200 includes a PMOS transistor 204 and an NMOS transistor 206 which receive input signals (i.e., each transistor 204 receives one of the following signals: $V_{EN\_P3}$, $V_{EN\_N3}$, $V_{EN\_N1}$, $V_{EN\_P1}$) that all generally follow each other and indicate the data to be furnished at the output of the driver 201. Like typical CMOS inverters, the drains of the transistors 204 and 206 are coupled together to form the output of the inverter 203, 205. However, each inverter 203, 205 also includes NMOS 208 and PMOS 202 slew rate compensation transistors. The NMOS transistor 208 has its drain-source path coupled between the drain-source path of the transistor 206 and ground, and the gate of the NMOS transistor 208 receives the $V_{NBIAS}$ signal. The higher the voltage level of the $V_{NBIAS}$ signal, the faster the predriver 203, 205 responds to low-to-high transitions in the input signal coupled to the NMOS transistor 206. As a result, the voltage level of the $V_{NBIAS}$ signal controls the slope 232 (see FIG. 13) of high-to-low transitions, and the voltage level $V_{PBIAS}$ signal controls the charge up slope 230 of the predriver output signal. The driver 201 inverts the output signal of the predriver 200.

The PMOS transistor 202 and the $V_{PBIAS}$ signal function in a similar manner to control the positive slew rate of the predriver 200. The PMOS transistor 202 has its source-drain path coupled between the source-drain path of the transistor 204 and ground, and the gate of the NMOS transistor 202 receives the $V_{PBIAS}$ signal. The lower the voltage level of the $V_{PBIAS}$ signal, the faster the predriver 203, 205 responds to high-to-low transitions in the input signal coupled to the PMOS transistor 204. As a result, the voltage level of the $V_{PBIAS}$ signal controls the slope 230 (see FIG. 13) of low-to-high transitions of the predriver output signal. Thus, the voltage level of the $V_{PBIAS}$ signal controls the positive slew rate of the predriver 200.

Figure 14:
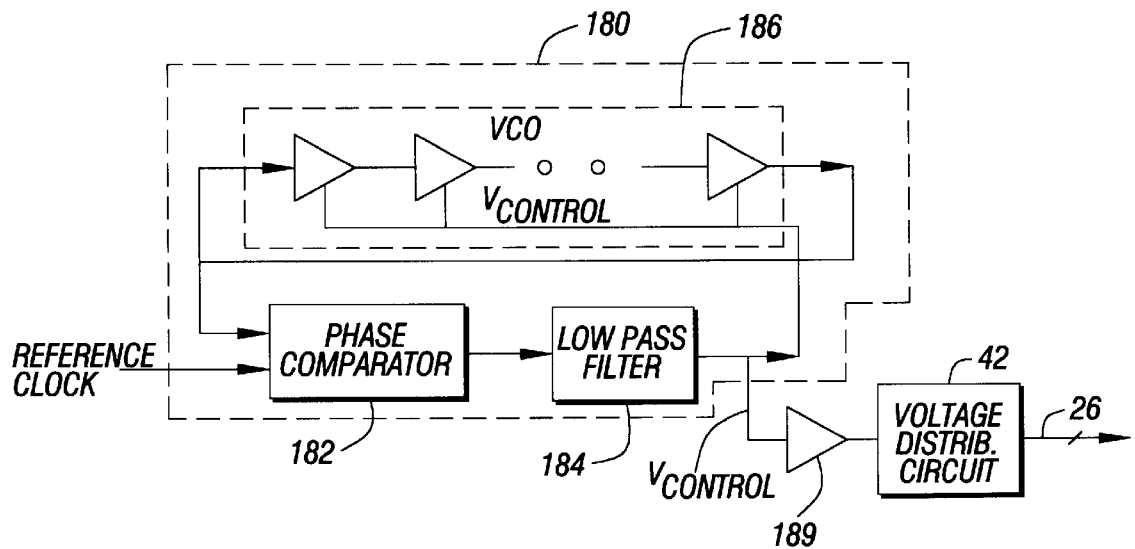
FIG. 14 is a schematic diagram of a phase locked loop circuit.

Referring to FIG. 14, in other embodiments, a phase locked loop (PLL) circuit 180 replaces the DLL circuit 40. The PLL circuit 180 might be, for example, a preexisting PLL used for other purposes (e.g., clock generation and/or frequency doubling) on the integrated circuit. Instead of the delay chain 45, the PLL circuit 180 has a chain 186 of voltage controlled oscillators. The delay chain 186 may have a different optimization point (because of low timing jitter, for example) other than the circuit being compensated. The frequency of the output signal of each of the oscillators is controlled by a control voltage signal (called $V_{CONTROL}$. The $V_{CONTROL}$ signal is also used to compensate the circuit 30. In embodiments where a preexisting PLL circuit is used, to keep from disturbing the operation of the PLL circuit 180, the $V_{CONTROL}$ signal is fed through an isolation amplifier 189 which is coupled between the PLL circuit 180 and the voltage scaling circuit 42. The PLL 180 has a phase comparator 182 that replaces the comparator 48 and a low pass filter 184 that replaces the filter 52.

Other embodiments are within the scope of the following claims. For example, instead of compensating the speed or slew rate of the circuit, in other embodiments, the output resistance of the circuit 30 may be compensated. This may be accomplished, for example, by regulating a voltage level applied to an output stage. In another example, a differential input receiver may be compensated to reduce the input delay between the fast and slow conditions.

As other examples, in different embodiments, the circuit 30 may be an integrated circuit package (e.g., a chip), a circuit of an integrated circuit package, or a circuit formed on a die of a multiple die integrated circuit package.

As examples of yet other embodiments, the locked loop circuits may be digital circuits instead of the analog circuits described above. In this manner, compensation control bits are generated from a digital control signal of the locked loop circuit. These bits may be directly used or converted to an analog form and then used for compensation. The compensation voltages may be obtained, for example, by passing the digital control signal through a digital-to-analog converter.

Examples of additional embodiments also include using a digital control signal generated by a digital locked loop circuit. Instead of converting the digital control signal into an analog signal, the bits of the digital control signal are used to selectively enable pass transistors that are configured to (when enabled) switch networks into and out of the circuit to be compensated. For example, these networks might be used to adjust a compensation voltage or provide a desired delay.

While the invention has been disclosed with respect to a limited number of embodiments, those skilled in the art will appreciate numerous modifications and variations therefrom. It is intended that the appended claims cover all such modifications and variations as fall within the true spirit and scope of the invention.

What is claimed is:

1. A system comprising:
   first circuits, each first circuit having a first slew rate being compensated by a different first signal that is associated with said each first circuit; and
   locked loop circuits electrically coupled to the first circuits and adapted to receive a commonly received periodic signal, each locked loop circuit being adjacent to a different one of the first circuits and connected to generate the first signal associated with said different one of the first circuits based on [a] the periodic signal.

2. The system of claim 1, wherein at least one of the locked loop circuits comprises a phase locked loop circuit.

3. The system of claim 1, wherein at least one of the locked loop circuits comprises a delay locked loop circuit.

4. The system of claim 1, wherein at least one of the locked loop circuits comprises an analog locked loop circuit.

5. The system of claim 1, wherein each locked loop circuit is connected to furnish a control signal, further comprising:
   a voltage distribution circuit, the voltage distribution circuit connected to receive the control signal and furnish the first signal based on the control signal.

6. The system of claim 1, wherein the first slew rate of each first circuit is responsive to a local climate, and each locked loop circuit comprises:
   a second circuit having a second slew rate that is responsive to the local climate of the adjacent first circuit and the associated first signal, the second circuit connected to receive the periodic signal and generate another periodic signal based on at least the first signal and the second slew rate; and
   a phase comparator connected to compare the phases of the periodic signals and based on the comparison, adjust the first signal to cause the phase of the periodic signals to be substantially a predetermined phase difference apart.

7. The system of claim 6, wherein the second circuit includes a substantial electrical equivalent of the first circuit.

8. The system of claim 6, wherein the first circuit and the second circuit both comprise predrivers.

9. The system of claim 6, wherein the local climate comprises a temperature near the first circuit.

10. The system of claim 6, wherein the local climate comprises one or more parameters of a fabrication process near the first circuit.

11. The system of claim 6, wherein the locked loop circuit comprises a phase locked loop circuit and the second circuit comprises a voltage controlled oscillator.

12. A method for use with a commonly received periodic signal and first circuits, each of the first circuits having a slew rate, comprising:

near each of the first circuits, using a different locked loop circuit to receive the periodic signal and generate a different control signal indicative of a locked on frequency; and using the periodic signal and the control signals to compensate the slew rates of the first circuits.

\* \* \* \* \*

UNITED STATES PATENT AND TRADEMARK OFFICE
CERTIFICATE OF CORRECTION

PATENT NO. : 5,973,526
DATED : October 26, 1999
INVENTOR(S) : Sanjay Dabral

It is certified that error appears in the above-identified patent and that said Letters Patent is hereby corrected as shown below:

In col. 8, line 36, please delete "[a]".

Signed and Sealed this

Sixteenth Day of May, 2000

Attest:

Q. TODD DICKINSON

Attesting Officer

Director of Patents and Trademarks